(12) United States Patent
Liu et al.

(10) Patent No.: US 12,332,308 B2
(45) Date of Patent: Jun. 17, 2025

(54) PROCESSING DEVICES FOR REDUCING SCAN TRAFFIC, METHOD AND COMPUTER PROGRAM

(71) Applicant: Intel Corporation, Santa Clara, CA (US)

(72) Inventors: Min Liu, Portland, OR (US); Jaemon Franko, Gig Harbor, WA (US); Xia Jin, Shanghai (CN); Xiang Li, Shanghai (CN); Jiaqi Liu, Shanghai (CN); Krishna Surya, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/551,879

(22) PCT Filed: Jun. 25, 2021

(86) PCT No.: PCT/CN2021/102560
§ 371 (c)(1),
(2) Date: Sep. 22, 2023

(87) PCT Pub. No.: WO2022/267065
PCT Pub. Date: Dec. 29, 2022

(65) Prior Publication Data
US 2024/0159829 A1 May 16, 2024

(51) Int. Cl.
*G01R 31/3185* (2006.01)

(52) U.S. Cl.
CPC ........ *G01R 31/318591* (2013.01); *G01R 31/31853* (2013.01); *G01R 31/318547* (2013.01)

(58) Field of Classification Search
CPC ...... G01R 31/318591; G01R 31/31853; G01R 31/318547; G06F 11/00
USPC ........................................................ 714/726
See application file for complete search history.

(56) References Cited

U.S. PATENT DOCUMENTS

| | | | | |
|---|---|---|---|---|
| 5,983,017 A | * | 11/1999 | Kemp | G06F 11/3656 714/724 |
| 6,574,762 B1 | | 6/2003 | Karimi et al. | |
| 7,930,606 B2 | * | 4/2011 | Machimura | G06F 11/2242 714/724 |
| 2013/0086441 A1 | * | 4/2013 | Yang | G01R 31/318555 714/E11.155 |
| 2013/0166975 A1 | * | 6/2013 | Son | G06F 21/85 714/E11.155 |

(Continued)

FOREIGN PATENT DOCUMENTS

| | | |
|---|---|---|
| CN | 102880536 A | 1/2013 |
| CN | 107577635 A | 1/2018 |
| CN | 1269906 A | 10/2023 |

*Primary Examiner* — James C Kerveros
(74) *Attorney, Agent, or Firm* — 2SPL Patent Attorneys PartG mbB; Yong Beom Hwang

(57) ABSTRACT

A processing device (30, 710) for reducing scan traffic is provided. The processing device (30, 710) comprises one or more interfaces (32, 718) configured to transmit information to at least one register access interface (759, 761) and processing circuitry (34) configured to control the one or more interfaces. Further, the processing circuitry (34) is configured to obtain register parameters of at least one functional unit (760, 762) of a processing unit (750) and to generate an improved bulk register comprising the register parameters of the at least one functional unit.

20 Claims, 9 Drawing Sheets

(56) References Cited

U.S. PATENT DOCUMENTS

| | | | |
|---|---|---|---|
| 2013/0238948 A1* | 9/2013 | Kunie | G01R 31/3177 714/727 |
| 2014/0181605 A1* | 6/2014 | Lingannagari | G01R 31/318555 714/727 |
| 2016/0092222 A1* | 3/2016 | Keppel | G06F 9/384 712/228 |
| 2019/0286223 A1 | 9/2019 | Furman et al. | |

* cited by examiner

PROCESSING DEVICES FOR REDUCING SCAN TRAFFIC, METHOD AND COMPUTER PROGRAM

FIELD

The present disclosure relates to the field of verifying designs and/or testing printed circuit boards (PCB). In particular, examples relate to processing devices for reducing scan traffic, a method and a computer program.

BACKGROUND

Verifying designs and/or testing (PCB) can be performed using different approaches. For example, JTAG is a leading industry standard for scan/debug access. However, slow data access does not best address scenarios where a scan/debug data is highly data intensive. Thus, there may be a need to improve a scan/debug process, e.g., to reduce scan/debug traffic.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of the group A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
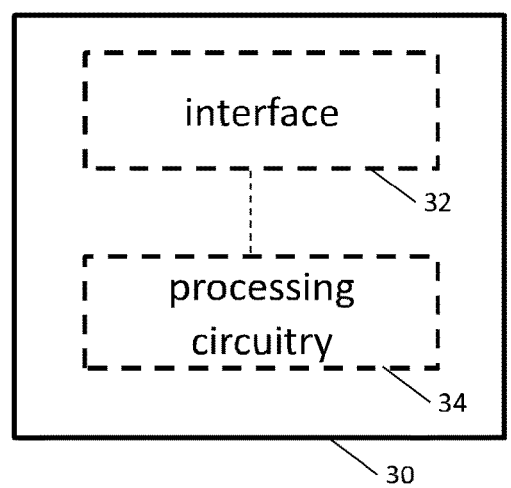
FIG. 1 shows a block diagram of an example of a processing device for reducing scan traffic.

FIG. 1 shows a block diagram of an example of a processing device 30 for reducing scan traffic. The processing device 30 comprises one or more interfaces 32 configured to transmit information to at least one register access interface and processing circuitry 34 configured to control the one or more interfaces 32. Further, the processing circuitry 34 is configured to obtain register parameters of at least one functional unit of a processing unit and to generate an improved bulk register comprising the register parameters of the at least one functional unit. By generating the improved bulk register requests to multiple register can be issued with just one bulk request. Thus, a scan/debug traffic for addressing multiple requests, e.g., from an external debug host to a debug target, may be reduced, which may lead to e.g., a decreased latency for processing the multiple requests. For example, instead of polling each register request individually, which causes high latencies on the serial bus between processing device 30 (e.g., the debug host) and the register access interface (e.g., the debug target), all register requests may be sampled in the improved bulk register to poll all register requests with only one bulk request on the serial bus. This may lead to a significant reduction in latency and increase in performance. For example, the processing device 30 may be a debug host. For example, the register access interface may be a register bus of a debug target.

Those skilled in the art would readily recognize that the improved bulk register is a improved bulk register access to multiple single registers combined in the improved bulk register. For example, the improved bulk register is an ordered set of register accesses (e.g., given by register requests) as an uninterruptable scan access, e.g., to a debug target.

For example, the improved bulk register may solve multiple performance problems for JTAG-based debug data access, still while allowing for multiple directed run-time power management framework (DFx) paths to meet higher level debug request flows. In the art, it is only possible to address one register request at a register bus at a time for JTAG-based debug data access. Thus, by generating the improved bulk register multiple register requests can be accessed with just one bulk request at the register bus.

A register parameter may comprise information to address a functional unit itself, e.g., to which functional unit the register belongs and/or to address the specific register within the functional unit. Thus, a register parameter may comprise all information to request a register access e.g., by a debug host (the processing device 30) using a serial bus (the one or more interfaces 32) and a register bus (the at one least one register access interface). For example, a register parameter may define a register request.

The register parameters may be obtained by receiving information of a plurality of registers of at least the one functional unit of the processing unit. For example, the register parameters may comprise information about all register of each functional unit of the processing unit. Thus, the register parameters comprise information to address each register of the processing unit/functional units. Optionally or alternatively, in an example the processing circuitry 34 may be further configured to obtain the register parameters by dividing the processing unit into the at least one functional unit and addressing register parameters to the at least one functional unit. This allows the processing unit to decide which part of the processing unit can be responsible for a desired function.

A functional unit can be a (sub)facility in the processing unit (e.g., a microprocessor, piece of silicon, processor etc.). For example, the functional unit may be determined by a unique job and/or by a spatial position. For example, the functional unit may fulfill a partial purpose of the processing unit.

In an example, the processing circuitry 34 may be further configured to generate the improved bulk register by compiling the register parameters into a low-level implementation. The low-level implementation may be generated by a scan compiler (see below, especially FIG. 2). The scan compiler may take a flow of high-level debug register requests, e.g., based on the address parameters, and may produce the improved bulk register, e.g., an improved bulk register low-level JTAG scan payload targeting the DFx. Additionally, the scan compiler may use target topology information, e.g., information about a register bus to generate the improved bulk register. Additionally, the scan compiler may use compiler options/debug operations (e.g., compiler configuration, a desired debug operation etc.) to generate the improved bulk register.

For example, the compiling (e.g., by the scan compiler) may be performed in an analogous way as it is known from a compiler in the art, e.g., for a high-level computer language. For a language compiler, the input is the high-level source code and a set of compiler switches, and the output is an executable in machine language, usually highly optimized, for a specific CPU core.

The improved bulk register can be generated (e.g., by compiling using the scan compiler) by sampling all register requests into the improved bulk register, which lead to a significant performance increase by avoiding register access interface latency, e.g., at a serial bus, register bus, etc. For example, the improved bulk register can be generated by merging every (single) register request in the improved bulk register. Further, the improved bulk register may reduce an effort for enabling pre/post scans around each register request. Additionally, during the generation of the improved bulk register redundancy of the multiple register requests can be removed. Additionally, during the generation of the improved bulk register an improvement for accessing the register requests of the improved bulk register may be performed, so that a resulting scan may be performed with less computational effort. Thus, the same logic work can be done with less data being transmitted (see especially FIG. 12).

For example, the improved bulk register may allow redundancy removal optimizations that cannot otherwise be done if the scan/debug process could not be guaranteed to be uninterruptable. By generating the improved bulk register the multiple register requests can be requested in a row without interruptions, thus enabling to remove redundancy during generation, e.g., by compiling the register parameters into a low-level implementation, since e.g., no other register request may interrupt the processing of the sampled register requests in the improved bulk register. In principle, by compiling the register parameters into a low-level implementation the high-level register (read) requests are compiled into a single low-level implementation. Thus, the improved bulk register no longer comprises the high-level register request, but rather a low-level implementation of the register requests. For example, after compiling the improved bulk register comprises solely information about each register request to process the register request (e.g., the improved bulk register may have no longer any knowledge of which processing unit/functional unit was targeted, or what the higher-level operations register requests were, see especially the scan compiler FIG. 2).

For example, the low-level implementation may avoid significant register access interface latency costs, do not require enabling pre/post scans around each element, and/or allow for redundancy removal optimizations. Thus, the low-level implementation may lead to several advantages, which are of high value, e.g., to debug a processing unit/functional unit. For example the processing unit may be a computation platform like a data center or edge computing.

Since the volume of debug data is significantly higher, remote debug over the network can have costly and unpredictable latencies (while still maintaining good throughput), and the debug to root-cause cycle may be time-critical. Reworking a debug client to use the low-level implementation may result in orders of magnitude better performance for throughput-dependent debug tool flows.

In an example, the processing circuitry 34 may be further configured to generate execution information for the improved bulk register. The execution information may comprise all information needed to use the improved bulk register, e.g., information how to execute the low-level implementation. Thus, by generating execution information the improved bulk register may be used for several times, e.g., by loading the improved bulk register from a storage medium and executing the improved bulk register using the execution information and/or the improved bulk register may be used by a further processing circuitry without a need of generating the improved bulk register. For example, an execution manager is generated which comprises the execution information and which can be transmitted with the improved bulk register to the further processing circuitry.

In an example, the processing circuitry 34 may be further configured to transmit the improved bulk register to the at least one register access interface. Further, the processing circuitry 34 may be configured to receive scan information about a scan performed for the at least one functional unit using the improved bulk register from the at least one register access interface and to generate control information by mapping the received scan information to the register parameters. For example, the at least one register access interface may be a register bus. Thus, by transmitting the low-level implementation to the register bus multiple registers may be addressed at one time and a scan through these multiple registers can be guaranteed to be uninterruptable.

Further, the information about the scan of the multiple register requests can be received by just one messages. For example, the multiple registers sampled in the improved bulk register using the low-level implementation may enable the processing circuitry 34 to receive a message from the at least one register access interface, which comprises information about all register requests in the improved bulk register. Thus, receiving of the scan information may improve a performance due to a reduced latency e.g., between a debug host (the processing device 30) and a serial bus (the at one least one register access interface) since only one message with scan information comprises information about all register requests of the improved bulk register.

The generation of the control information can be performed with knowledge about the generated improved bulk register, e.g., by the scan compiler. Since, the scan compiler knows the order of the multiple registers in the improved bulk register, the scan compiler can map the scan information to each register of the multiple registers. Thus, scan information like debug information can be achieved for multiple registers by transmitting solely one request between the processing device 30 and the at least one register access interface (e.g., of the processing unit), decreasing latency.

In an example, the processing circuitry 34 may be further configured to generate decoding information for mapping the received scan information to the register parameters. Thus, the decoding information can be used multiple times for decoding multiple requests of the same improved bulk register.

In an example, the processing circuitry 34 may be further configured to store the improved bulk register, the execution information and/or the decoding information in an improved bulk register processing file. Thus, the information about the improved bulk register, the execution information and/or the decoding information can be used multiple times. For example, a general solution for caching, signing, and/or reusing the scan flow of the improved bulk register that was generated by the processing circuitry 34 can be used multiple times for the processing device 30 and/or can be used across different processing circuitries, e.g., the further processing circuitry. Thus, different tool instances can utilize the improved bulk register using the improved bulk register processing file. Further, solution for applying scan optimizations across a whole message may be achieved.

In an example, the processing circuitry 34 may be further configured to transmit the improved bulk register processing file to a further processing circuitry. This enables the further processing circuitry to use the improved bulk register without having to generate the improved bulk register. For example, the improved bulk register processing file can be shared among different processing units and/or tool instances. With the possibility of pre-generated/reused and/or signed scans using the improved bulk register/improved bulk register processing file, even an anemic debug host can achieve a significant performance gain, since it only must act as an engine for driving the low-level scans (using the low-level implementation of the improved bulk register) and processing the results. Thus, a significant performance gain can be achieved for different processing units and/or tool instances.

In an example, the processing circuitry 34 may be further configured to generate the improved bulk register by choosing a scan operation. Thus, the improved bulk register can be generated in dependence of a desired scan operation, e.g., a debug operation.

In an example, the processing device 34 may be further configured to generate the low-level implementation using only register parameters which are assigned to the same register access interface. For example, the improved bulk register comprises only register parameters which are addressed to same register access interface, e.g., the same register bus. Thus, to process the improved bulk register only one request to one register access interface may be required.

As shown in FIG. 1 the respective one or more interfaces 32 are coupled to the respective processing circuitry 34 at the processing device 30. In examples the processing circuitry 34 may be implemented using one or more processing units, one or more processing devices, any means for processing, such as a processor, a computer or a programmable hardware component being operable with accordingly adapted software. Similar, the described functions of the processing circuitry 34 may as well be implemented in software, which is then executed on one or more programmable hardware components. Such hardware components may comprise a general-purpose processor, a Digital Signal Processor (DSP), a micro-controller, etc. The processing circuitry 34 is capable of controlling the interface 32, so that any data transfer that occurs over the interface and/or any interaction in which the interface may be involved may be controlled by the processing circuitry 34.

In an embodiment the processing device 30 may comprise a memory and at least one processing circuitry 34 operably coupled to the memory and configured to perform the below mentioned method.

In examples the one or more interfaces 32 may correspond to any means for obtaining, receiving, transmitting or providing analog or digital signals or information, e.g. any connector, contact, pin, register, input port, output port, conductor, lane, etc. which allows providing or obtaining a signal or information. An interface may be wireless or wireline and it may be configured to communicate, i.e. transmit or receive signals, information with further internal or external components. The one or more interfaces 32 may comprise further components to enable communication between vehicles. Such components may include transceiver (transmitter and/or receiver) components, such as one or more Low-Noise Amplifiers (LNAs), one or more Power-Amplifiers (PAs), one or more duplexers, one or more diplexers, one or more filters or filter circuitry, one or more converters, one or more mixers, accordingly adapted radio frequency components, etc.

More details and aspects are mentioned in connection with the examples described below. The example shown in FIG. 1 may comprise one or more optional additional features corresponding to one or more aspects mentioned in connection with the proposed concept or one or more examples described below (e.g., FIG. 2-12).

Figure 2:
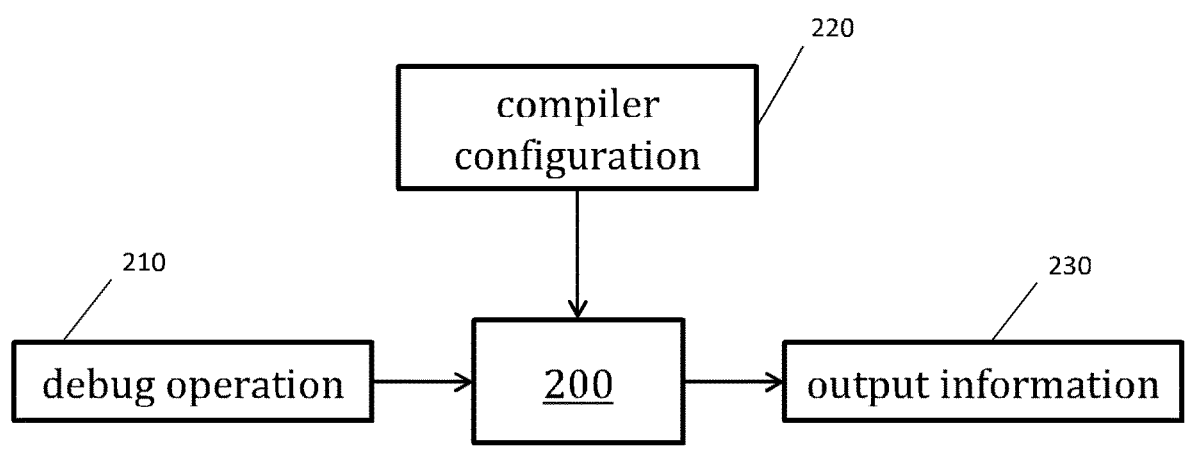
FIG. 2 shows an example of a scan compiler.

FIG. 2 shows an example of a scan compiler 200. The scan compiler 200 may receive different input information 210, 220 for generating the improved bulk register by compiling and output output information 230, which comprises the improved bulk register. The scan compiler (tool) 200 addresses the huge performance issue of accessing large amounts of state data (CPU, PCH, Non-Volatile DIMMs, etc.) in debug tools. Pursuant to that, the scan compiler 200 may address several problems like it abstracts away the knowledge of how to build the most efficient low-level scans for multiple abstraction levels of operations, it allows pre-building and reusing already existing scans, so that the host does not have to pay the penalty of creating the same scan redundantly and/or it provides a mechanism for executing these scans on supported tools and decoding the bulk output that results from a scan. In principle, the scan compiler can be designed solely to optimize multiple high-level register read (e.g., defined by the register parameters) to generate a low-level implementation. Thus the scan compiler does not need to perform further operation based on the register parameters. For example, the high-level operation such like high-level read may belong to the input information 210 (see especially FIG. 12).

For example the scan compiler 200 may use information on debug operations 210 (e.g., add register[A] read, add register[B] write, add register[C] read etc.) for generating the improved bulk register. The information about the debug operations 210 may be provided by a list of (desired) debug operations. Further, the scan compiler 200 may receive information about a compiler configuration 220. For example, the information about the compiler configuration 220 may comprise information about a functional unit existing in the debug target (e.g., the processing unit) (and which provide a DFx path), which functional unit is being accessed, which tool is being targeted, which DFX scan path is taken for the operation, which environmental conditions affects the scan (e.g., scan interface clock rate) or which scan optimizations and knob settings may be used.

Based on the input information 210, 220 the scan compiler 200 may generate output information 230 comprising the improved bulk register (e.g., the improved low-level implementation), the execution information and/or the decoding information. For example, the output information 230 may comprise the improved bulk register, the execution information and the decoding information. Thus, the output information 230 of the scan compiler 200 may be a set of three distinct payloads, which can subsequently be used (e.g., by storing in and/or loading from the improved bulk register processing file) to execute the debug flow and then decode the bulk scan output which is received. Namely, the three distinct payloads may be:

The improved bulk register (also referred as ScanContainer with reference to the scan compiler 200) may be a record of the optimized, raw, lowest-level operations of the higher-level register requests (obtained by the requests parameters) which were compiled down to. This improved bulk register may have no longer any knowledge of which processing unit/functional unit was targeted, or what the higher-level operations (register requests) were. The improved bulk register could be stored in a format (e.g., the improved bulk register processing file) that requires the least amount of processing resources when the improved bulk register is executed, e.g., for the processing unit.

The execution information (also referred as ScanRequirements with reference to the scan compiler 200) may be used by a tool-specific execution manager to know how to execute the contents of the ScanContainer. It provides information on which processing unit/functional unit the ScanContainer can be runin the future. It also provides the prerequisites that must be met before executing the ScanContainer.

The decode information (also referred as OutputProcessor with reference to the scan compiler 200) may be used to decode the raw, low-level data (scan information) that is received from the at least one register access interface after the scan of the processing unit/the at least one functional unit once the ScanContainer is executed. It may allow the processing device to take the bulk output data of the at least on register access interface, perform a validation check, and create a logical return data for each of the high-level accesses that were originally requested.

In principle, the scan compiler may support reading and/or writing a register (of the improved bulk register) for the at least one functional unit. Additionally, the scan compiler may also perform further control and access operations on the at least one functional unit, e.g., trigger a side-effect in the processing unit (e.g., the silicon), access a state which is different or much larger than the addressed register or the register accesses themselves are constituent parts to performing other higher-level debug control/accesses. For example, for run-time monitoring (see below, e.g., FIG. 5) the scan compiler may be used to read large numbers of registers (especially periodically).

More details and aspects are mentioned in connection with the examples described above and/or below. The example shown in FIG. 2 may comprise one or more optional additional features corresponding to one or more aspects mentioned in connection with the proposed concept or one or more examples described above (e.g., FIG. 1) and/or below (e.g., FIG. 3-12).

Figure 3:
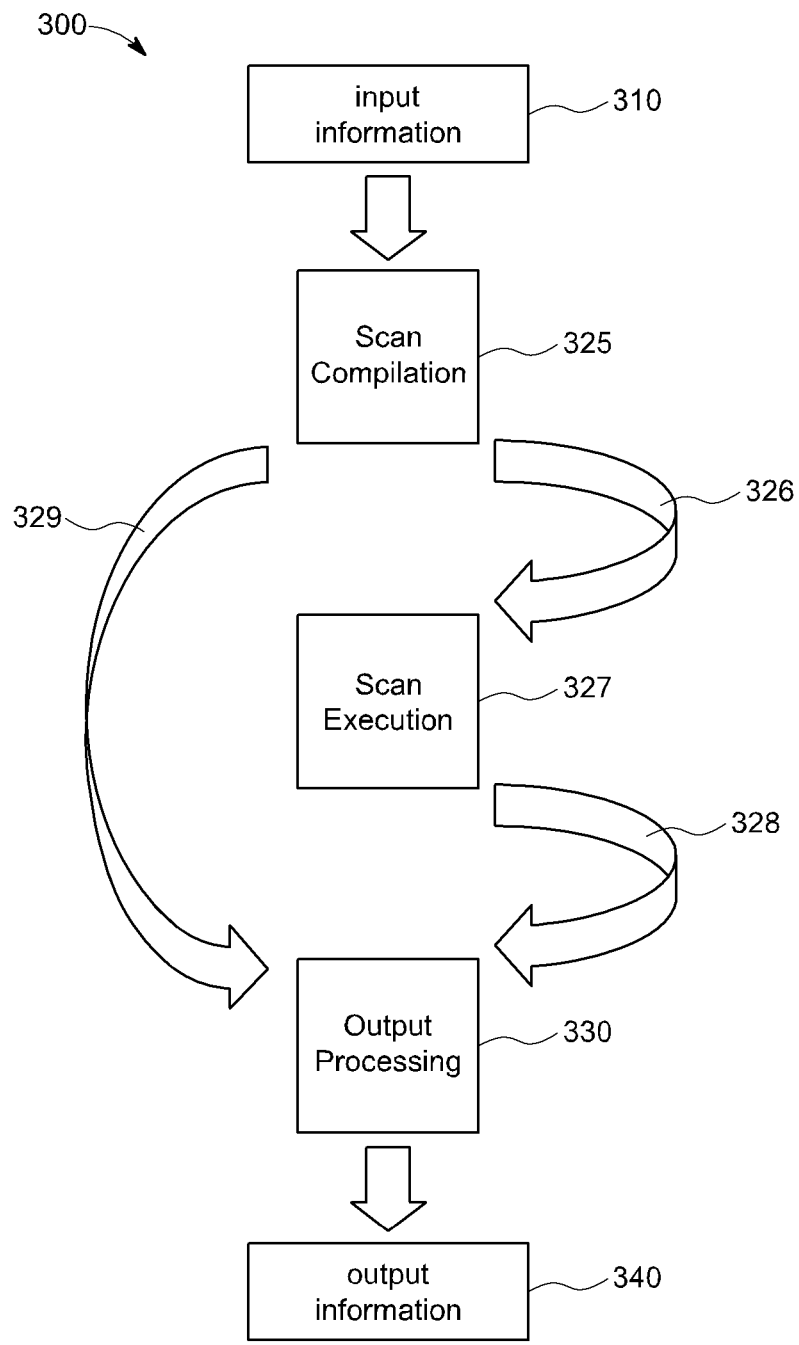
FIG. 3 shows a flow chart of a debug process based on the three distinct payloads described with reference to FIG. 2.

FIG. 3 shows a flow chart of a debug process 300 based on the three distinct payloads described with reference to FIG. 2. The three distinct payloads (ScanContainer, ScanRequirements and OutputProcessor) may be used to perform a debug process 300 of a processing unit. Input information 310 (e.g., high level scan register requests, target definition, compiler setting etc.) may be provided to a scan compiler (not shown). The scan compiler may perform a scan compilation 325 using the ScanContainer and the ScanRequirements to generate an improved bulk register which can be executed. This executable improved bulk register may be transmitted 326 for execution to the at least one register access interface. A scan execution 327 may be performed generating raw data, which can be transmitted 328 to the processing device. Thus, scan information of the processing unit, which can be used by the processing device for, e.g., debugging, can be received by the processing device. By combining the scan information transmitted 328 from the at least one register access interface and the decode information generated 329 by the scan compilation an output processing 330 can be performed. The output processing 330 may generate output information 340 by mapping the received scan information to the register parameters.

For example, to perform the debug process 300 the ScanContainer, ScanRequirements and OutputProcessor can be cached in memory, or serialized off to disk, and then reloaded during a future instance of the debug tool for reuse, so that the performance hit of having to recompile the scan is avoided (e.g., using the improved bulk register processing file). Where applicable, a scan built for one instance of a target processing unit/functional unit type, can be reused on other instances of that same target processing unit/functional unit type. A level of reusability can generally be determined with the information in the ScanRequirements payload, in combination with the input parameters used in the high-level debug operation.

For example, when a client of scan compiler is tasked with executing one of its generated improved bulk register (e.g., by loading from the improved bulk register processing file), the client may be responsible to ensure that scan prerequisites are met, and that the device being targeted for the scan is appropriate for the scan payload, before the scan is submitted to the at least one register access interface, e.g., a processing unit under debug. The information required to make these determinations may be obtained by the ScanRequirements payload.

After an executable improved bulk register may be generated and may be transmitted and scan information may be received, the client of scan compiler can use the OutputProcessor to postprocess the scan information (e.g., raw bulk scan data) to map it to the high-level register requests flow that was originally compiled. As part of postprocessing the scan information, the processing circuitry may also apply checks to the return data using the OutputProcessor to ensure that the scan worked as expected (e.g., was not overdriving the DFx, or working with DFx that were non-functional in the failed system).

For example, if the scan compiler is processing the high-level debug register requests flow, it may distill those high-level register requests through potentially multiple abstraction layers down to the lowest level JTAG scans that are required to be executed by a JTAG master/driver. During the compilation process, there may be optimizations made along the way at specific abstraction levels, and DFx paths may be chosen based on the topology of the target compute platform and the compiler switches.

For example, a debug scan optimization may take place whenever unnecessary functional redundancy in the scan is removed in the improved bulk register, thereby allowing the scan with the same functional effect to be issued with fewer JTAG clocks. There are many such optimizations (which can have corresponding defeaturing compiler switches) that can be applied at various levels, and these optimizations can accrue across the whole scan until the termination of the debug request flow. Some examples of the optimizations which can be applied are:

Redundant resource write removal: This is where the scan compiler remembers that a particular resource has been written to a specific value at some point in the flow, and if a new request comes in that might set it to the same value, the operation may be skipped. Examples of resources are the registers in the DIMMs, or registers in the CPU core or uncore, or be DRs or the IR of a TAP controller.

JTAG shift pipelining: This is where, because of the nature of how JTAG works, the result from a prior operation (i.e., register bus, or mailbox DRs) may be shifted out TDO concurrently with the new request being sent in TDI.

More details and aspects are mentioned in connection with the examples described above and/or below. The example shown in FIG. 3 may comprise one or more optional additional features corresponding to one or more aspects mentioned in connection with the proposed concept or one or more examples described above (e.g., FIG. 1-2) and/or below (e.g., FIG. 4-12).

Figure 4:
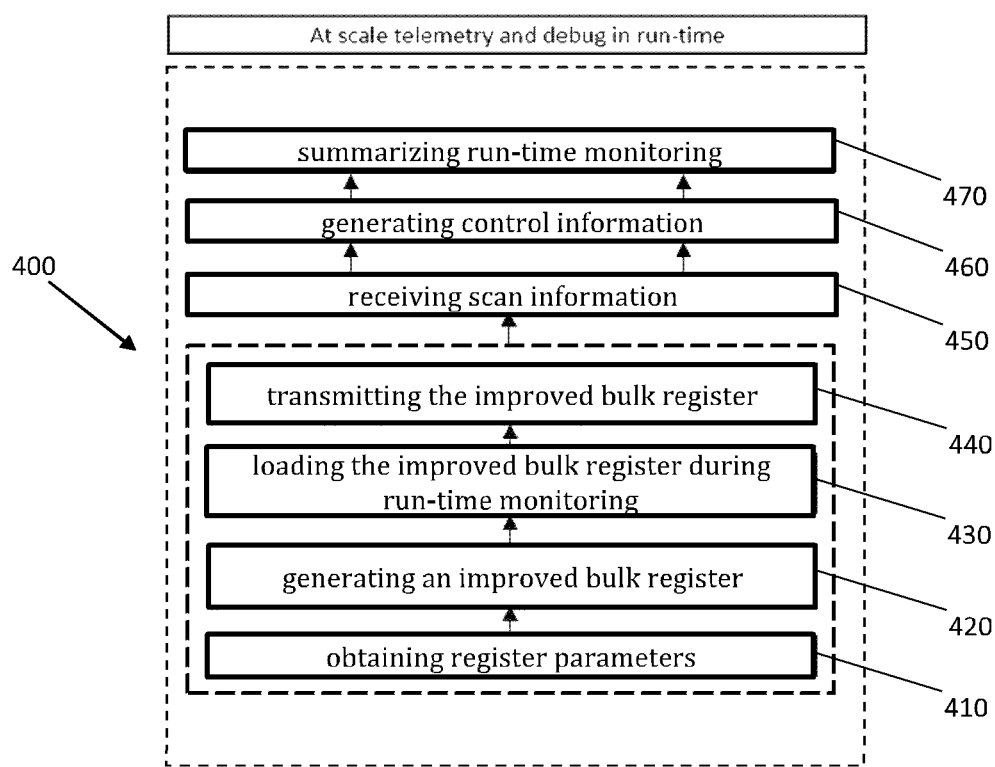
FIG. 4 shows an example of a method of run-time monitoring architecture.

FIG. 4 shows an example of a method 400 of run-time monitoring architecture. For example, the method 400 may provide telemetry at scale and run-time monitoring. In an example, the processing circuitry (e.g., the processing circuitry as described with reference to FIG. 1) may be further configured to perform run-time monitoring of the at least one functional unit using the control information. Thus, an improved run-time monitoring utilizing the improved bulk register may be provided.

Existing run-time monitoring methods/architectures can be divided into two classes. One leverages high-cost solutions such Logic Analyzer, IOT, VISA, NOA and requires sophisticated setups that is only suitable in a lab set up and cannot be scaled to data center environment. The other class that is data center is to use some OS or OOB method to collect real time telemetry data.

For example, existing debug methods may include collecting data when a system fails (such as catastrophic error, segment fault, x64 exception) and/or collect run-time data during system operation. However, post-failure data collection lacks the operating history leading to the failure and would require setting up a sophisticated or expensive DFX mechanism such as external Logic Analyzer or on-die trace and reproducing failures. This significantly increase a debug time and/or a cost for debugging. On the other side, existing low-cost run-time monitoring known in the art has significant limitation to detect transient register exceptions due to data accessibility and data collection performance. Existing scalable run-time monitoring methods tend to be limited by the performance of the data access due to single register access and lack the capability to catch transient errors that may or may not cause system failures later on. Thus, there may be a need to provide improved run-time monitoring, e.g., to monitor health of a processing unit/functional unit and error/status information at run-time with performance needed to capture transient exceptions of the silicon. For example, the improved run-time monitoring may be utilized in a data center environment to improve telemetry at scale and debug in run-time.

The improved run-time monitoring can be achieved using the improved bulk register as described above. For example, to generate the improved bulk register parameters for at least one functional unit of the processing unit register parameters may be needed. For example, the register parameters can be obtained 410 by dividing silicon into the at least one functional unit and defining registers for the at least one functional unit. These registers need to be monitored for run-time monitoring. This monitoring can be performed by utilizing the improved bulk register.

Thus, an improved bulk register may be generated 420 by the processing circuitry (e.g., by the scan compiler as described above, especially with reference to FIGS. 2 and 3). The improved bulk register may comprise all registers addressed to the same register bus of the at least one functional unit or a plurality of functional units. Thus, multiple requests addressed to different functional units, all using the same register bus, can be sampled in the improved bulk register. For example, the register parameters may be parameters needed to address a unique register in a functional unit over a register bus. The improved bulk register may only comprise register requests addressed to the same register access interface. Additionally, if the improved bulk register is generated it can be store in a data file (e.g., an xml file), e.g., in the improved bulk register processing file. Additionally, the improved bulk register may be further processed by the scan compiler, e.g., to reduce redundancies (this can be done, because an uninterruptable processing of the sampled register requests can be guaranteed by the improved bulk register as described above).

The improved bulk register may be loaded 430 during run-time monitoring to improve the run-time monitoring and may be transmitted 440 to the at least one register access interface.

The improved bulk register may be transmitted by the processing circuitry to the at least one register access interface, e.g., a silicon register access interface and scan information may be received 450 by the at least one register access interface. Thus, the improved bulk register leverages raw JTAG API access for driving multiple register request (scans), to silicon register access interface and receives scan information of all the register requests (scans).

Further, the received scan information may be used to generate 460 control information, e.g., by mapping the received scan information to each induvial register comprised in the improved bulk register. Thus, the control information can be used to monitor the processing unit for register errors and/or register status. The obtained data can be summarized 470 to provide an easy access to the run-time monitoring, e.g., to check a health of processing unit/the at least one functional unit and/or an error status.

The processing circuitry may generate control information by mapping the scan information to each register sampled in the improved bulk register. Finally, the control information can be decoded, e.g., to check a health and/or an error status of the at least on functional unit. Due to the fact, that in the improved bulk register multiple register requests are sampled the number of requests, which can be processed in a time can be greatly improved (e.g., a performance improvement of 50-100× times can be achieved), since latency time caused between the processing circuitry and the processing unit using the at least one register access interface can be decreased. Thus, an overhead of individual register access can be reduced, enabling an improved run-time monitoring, e.g., to detect run-time health of the at least one functional unit and transient exceptions evident in the register status (e.g., see FIG. 5c).

Utilizing the improved bulk register may leverage existing register access interface with no additional hardware cost (e.g., versus Logic Analyzer) and may significantly improve the performance of existing register access method, e.g., by 50-100× times as can be seen in Tab. 1.

TABLE 1

Performance gain for JTAG register access using the art and the improved bulk register.

| Register | Interface | Register count | JTAG register access (art) | Improved bulk register JTAG register access | Performance improvement |
|---|---|---|---|---|---|
| MC | GPSB | 22392 | 103 reg/s | 7223 reg/s | 70× |
| PMA | PMSB | 48534 | 160 reg/s | 9784 reg/s | 61× |

For example, the improved bulk register can be utilized for a data center environment for run-time silicon health and/or error detection, since data center may comprise an increased number of functional units (leading to a more crucial performance) per register bus leading to an even higher performance gain. However, the improved bulk register can also be utilized for all other electronic devices, such as personal computer, laptop, tablets, smartphones etc. Further, the usage of the improved bulk register may allow to catch an issue before it manifests into a system crash, enabling a user to take preventive measures without losing data.

More details and aspects are mentioned in connection with the examples described above and/or below. The example shown in FIG. 4 may comprise one or more optional additional features corresponding to one or more aspects mentioned in connection with the proposed concept or one or more examples described above (e.g., FIG. 1-3) and/or below (e.g., FIG. 5-12).

Figure 5A:
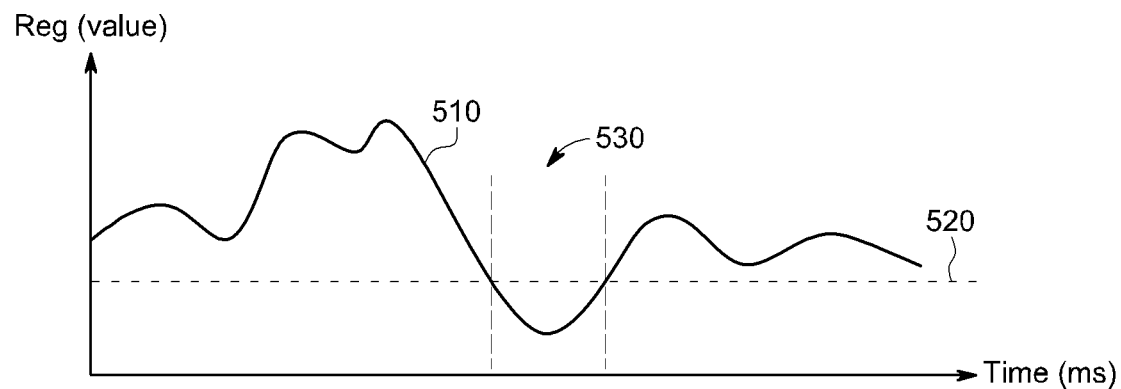
FIGS. 5a-5c shows a comparison of sampling rates achieved for run-time monitoring known from the art and (the improved) run-time monitoring utilizing the improved bulk register.
Figure 5B:
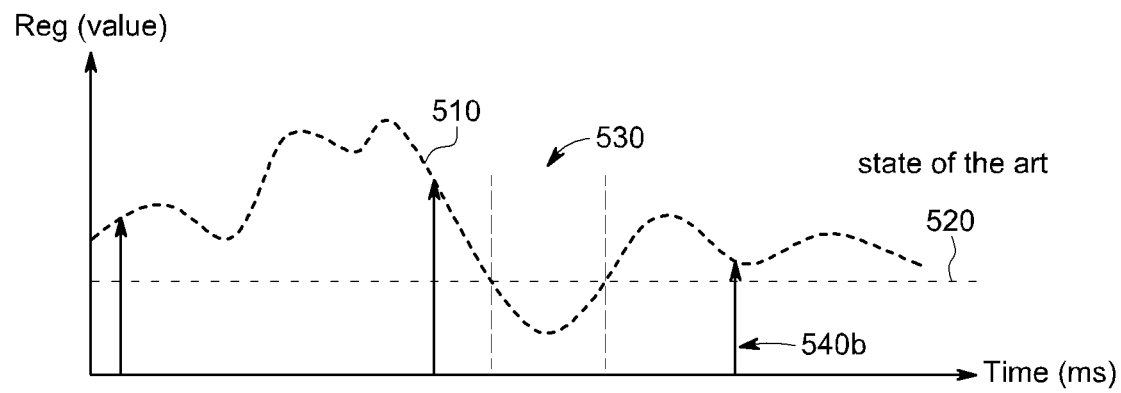
Figure 5C:
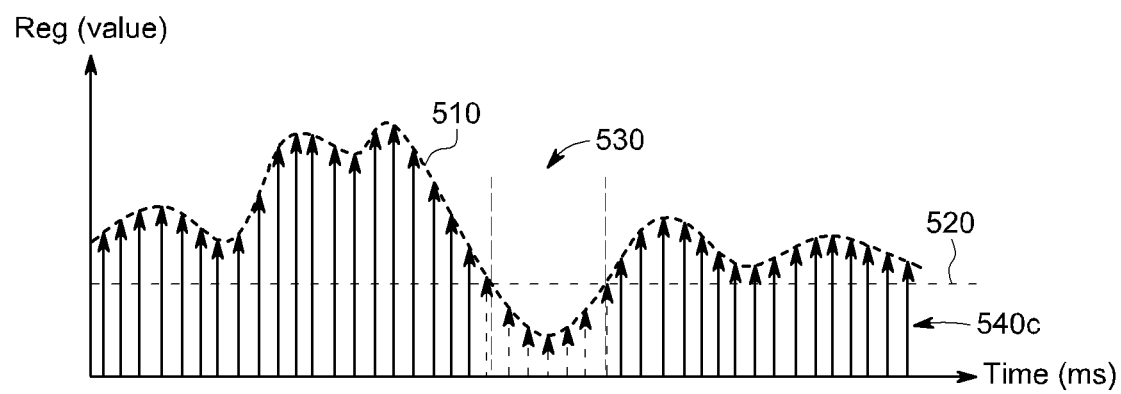

FIGS. 5a-5c shows a comparison of sampling rates achieved for run-time monitoring known from the art (FIG. 5b) and (the improved) run-time monitoring utilizing the improved bulk register (FIG. 5c). FIG. 5a shows a register value 510 over the time (in ms). As long as the register value 510 is above a threshold the processing unit/functional unit belonging to this register may be assumed to perform without an error. If the register value 510 is below the threshold 520 the processing unit/functional unit may be erroneous. For example, the processing unit/functional unit may be erroneous during a period 530, indicated by the dashed lines.

This erroneous state can be detected, if at the period 530 a snapshot of the register state is taken, e.g., by a register request. Thus, a periodic snapshot of the register state is taken in the art by register requests using the register access interface of the processing unit/functional unit. Since only one register request is addressed at a time in the art a sampling rate 540b may be too low to monitor each register of the processing unit/functional unit, which may lead to an under sampling, as can be seen in FIG. 5b. For example, in FIG. 5b the sampling rate 540b (which comprises only three snapshots of the register state indicate by the solid arrows) is too low to detect the erroneous state in the period 530.

On the other hand, the sampling rate 540c is increased due to the utilization of the improved bulk register, which enables the improved run-time monitoring and the processing device to notice the erroneous state in the period 530 (indicated by the red arrows in FIG. 5c). Thus, using the improved bulk register enables the processing device to catch erroneous states of the processing unit/functional unit which may be not noticed using the run-time monitoring of the art.

In an example, the processing circuitry may be further configured to perform periodic run-time monitoring on the at least one functional unit of the processing unit using the control information. For example, the improved run-time monitoring architecture using the improved bulk register, instead of discrete register requests which may rely on multiple layers of software (which may issue millions of their own requests) may significantly improve the sampling rate available for run-time monitoring. This may enable the processing circuitry periodic run-time monitoring with a higher reliability. Further, cooperating the improved bulk register with raw JTAG API access for driving large batch scan request with low-overhead using the improved bulk register and a better scaling TCLK can be achieved. This architectural modification may allow periodic run-time monitoring, with full integration of the processing unit/functional unit, to have vastly accelerated for register access, thus makes it able to detect silicon transient exceptions, fleeting issues and/or asymptomatic issues, which are only evident in a register state.

Further, the improved bulk register can be used for further application, e.g., the monitoring of a failure leading to a crash of the processing unit/functional unit. To identify a reason for the crash the processing device may need to determine data of register states, array states, scan chain states, etc. Thus, the identification of the reason for the crash can be resource intensive. By monitoring at least the register states using the improved bulk register, the crash can be traced back to the register states or can be excluded from the register states, decreasing further identification efforts. For example, the increased sampling rate can be utilized to hold the processing unit/functional unit in a read and write state if an erroneous register value is detected and to resume the processing unit/functional unit if register value is no longer erroneous.

More details and aspects are mentioned in connection with the examples described above and/or below. The example shown in FIG. 5 may comprise one or more optional additional features corresponding to one or more aspects mentioned in connection with the proposed concept or one or more examples described above (e.g., FIGS. 1-4) and/or below (e.g., FIGS. 6-12).

Figure 6:
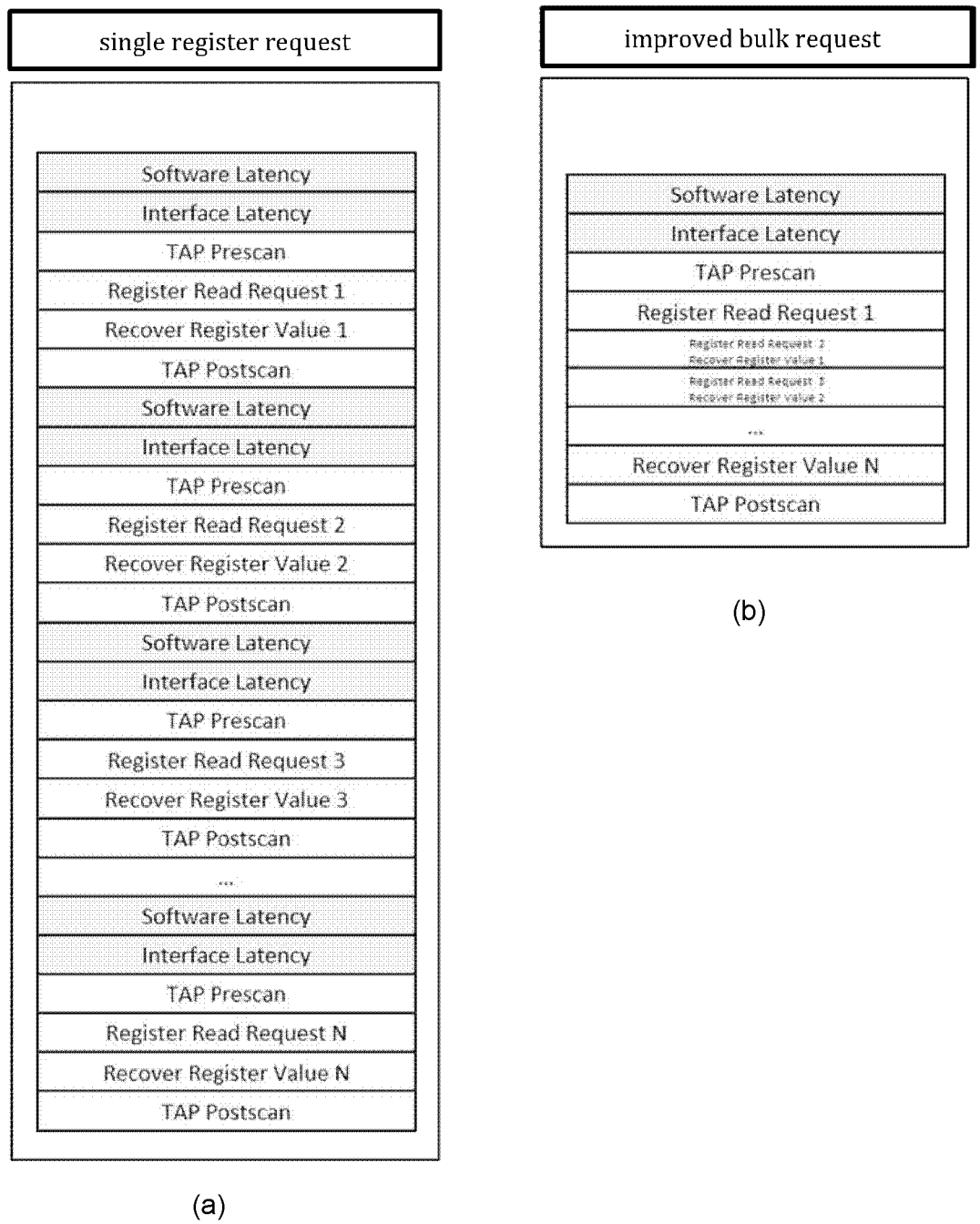
FIG. 6 shows a comparison of register access using discrete register access known from the art (6(a)) and the improved bulk register access (6(b))

FIG. 6 shows a comparison of register access using discrete register access known from the art (6(a)) and the improved bulk register access (6(b)). As can be seen the single register request causes software latency, interface latency, a TAP prescan and a TAP postscan for every register request, whereas the improved bulk register request causes only one software latency, interface latency, a TAP prescan and a TAP postscan for processing all register requests of the improved bulk register. Thus, the latency can be reduced by the new run-time monitoring architecture.

(b) of FIG. 6 shows a diagram for improved run-time monitoring with details for using batch, memory serialized and low-level JTAG register access to reduce massive software/interface latency and to improve the register access performance to improve telemetry at scale and debug for run-time monitoring.

More details and aspects are mentioned in connection with the examples described above and/or below. The example shown in FIG. 6 may comprise one or more optional additional features corresponding to one or more aspects mentioned in connection with the proposed concept or one or more examples described above (e.g., FIG. 1-5) and/or below (e.g., FIG. 7-12).

Figure 7:
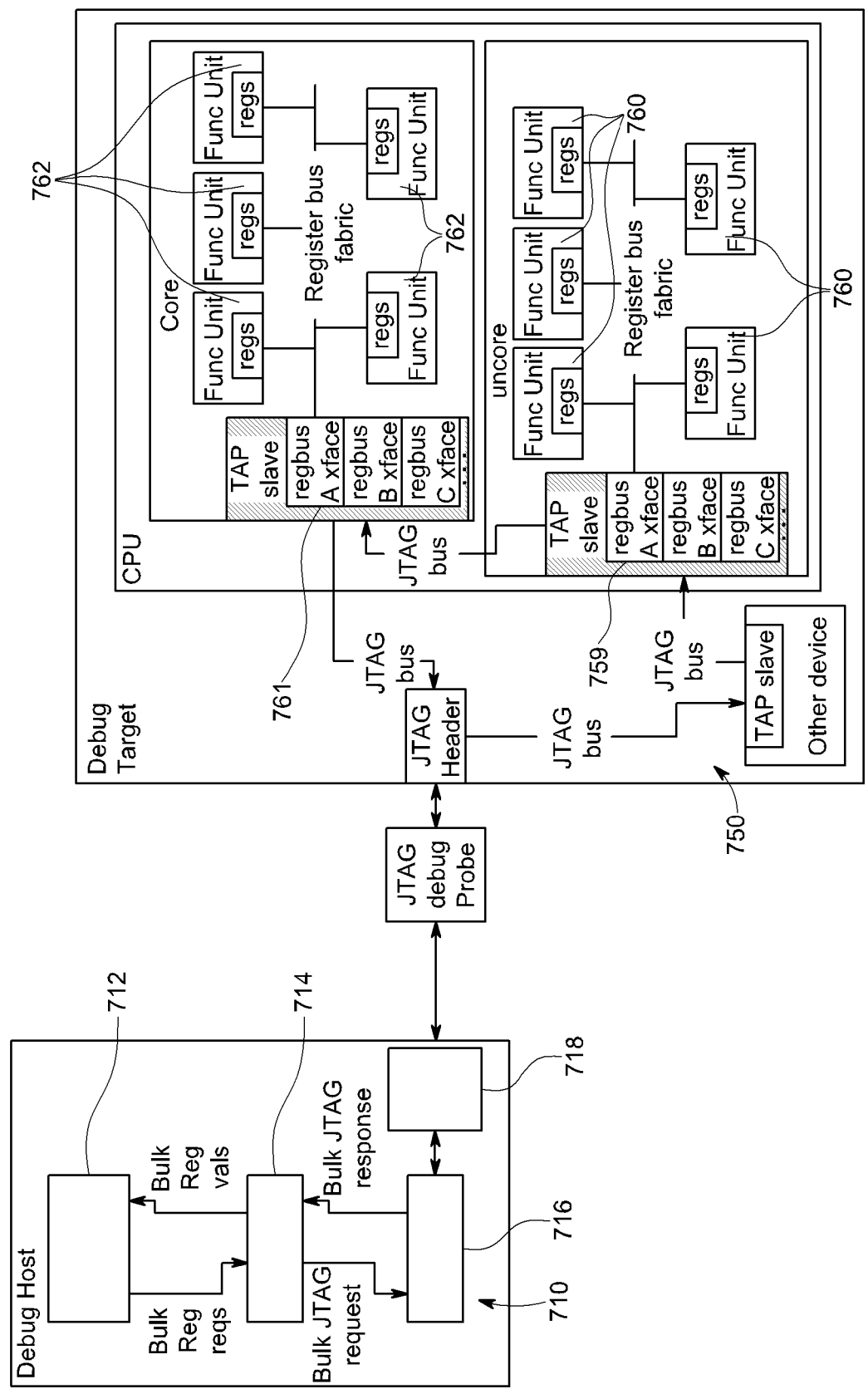
FIG. 7 shows an example of a system for performing a debug process.

FIG. 7 shows an example of a system 700 for performing a debug process. The debug process performed may be the debug process as described with reference to FIG. 3. The system 700 comprises a debug host 710 (e.g., the processing device as described with reference to FIG. 1) and a debug target 750 (e.g., the processing unit as described with reference to FIG. 1). The debug host 710 may comprise a run-time monitoring software 712 and a scan compiler 714 (e.g., the scan compiler as described with reference to FIGS. 2 and 3). Further, the debug host 710 may comprise a traditional JTAG debugger software 716 known in the art and a driver and host interface 718 (e.g., the one or more interfaces as described with reference to the processing device in FIG. 1), e.g., a universal serial bus.

The run-time monitoring software 712 may know what register should be periodically read in each functional unit 760, 762 in the debug target 750. Thus, the run-time monitoring software can sample all register requests which are addressed to the same register bus interface 759, 761 of a TAP slave to an improved bulk register. Further, the run-time monitoring software may issue a request using the improved bulk register. The improved bulk register can be transmitted to the scan compiler 714. Alternatively, the run-time monitoring software 712 can be a part of the scan compiler 714.

In principle, a TAP slave may be selected. Based on the determined TAP slave an associated register bus 759, 761 may be selected and for the run-time monitoring all register requests which belongs to the selected register bus 759, 761 may be sampled into the improved bulk register.

The scan compiler 714 can further process the improved bulk register. For example, the scan compiler 714 can generate a single low-level highly improved JTAG scan from the high-level register read requests of the improved bulk register.

Further, the scan compiler 714 can execute the improved bulk register through the JTAG debugger software 716 and the debug host 710 can transmit the improved bulk register to the debug target 750/functional units 760, 762 using the driver and host interface 718 and the respective register bus 759, 761.

When a scan of the debug target 750/functional units 760, 762 is completed, the debug host 710 may receive scan information, which comprises raw scan data. These raw scan data can be interpreted by the scan compiler 714 and control information can be generated (e.g., by mapping the received scan information to the register parameters/register requests). Using the control information error and/or status information about each functional unit 760, 762 addressed by the improved bulk register of the debug target 750 can be generated. This enables improved run-time monitoring, e.g., with an increased sampling rate.

For example, a performance gain can be achieved because the slower interface (e.g., typically MHz speed) between the debug host 710 and the debug target 750 may only be used to process the improved bulk register, so to process sampled register requests. For example, to transmit the improved bulk register and to receive scan information about a processing of the improved bulk register. The faster register bus fabric (e.g., typically GHz speed) between the register bus 759, 761 and the functional units 760, 762 may be used to process each register request of the improved bulk register, e.g., by performing a scan for each register request. Further, a performance gain can be achieved due to removal of redundancies in the improved bulk as described above.

More details and aspects are mentioned in connection with the examples described above and/or below. The example shown in FIG. 7 may comprise one or more optional additional features corresponding to one or more aspects mentioned in connection with the proposed concept or one or more examples described above (e.g., FIG. 1-6) and/or below (e.g., FIG. 8-12).

Figure 8:
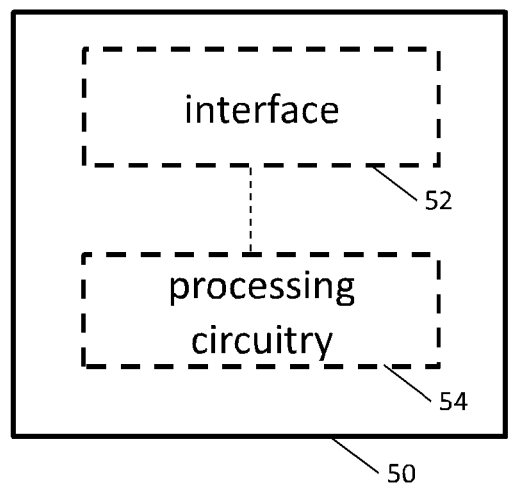
FIG. 8 shows a block of another example of a processing device for reducing scan traffic.

FIG. 8 shows a block of another example of a processing device 50 for reducing scan traffic. The processing device 50 comprises one or more interfaces 52 configured to transmit information to at least one register access interface and to receive information from another processing device and processing circuitry 54 configured to control the one or more interfaces 52. Further, the processing circuitry is configured to receive an improved bulk register processing file comprising information about an improved bulk register for at least one functional unit of a processing unit and to use this improved bulk register processing file for scanning the at least on functional unit. Thus, the processing device 50 may be enabled to use the improved bulk register, being able to generate the improved bulk register. Therefore, the improved bulk register can be used for every processing device and/or tool.

In an example, the processing circuitry 54 may be further configured to perform periodic run-time monitoring on the at least one functional unit of the processing unit using the improved bulk register processing file.

As shown in FIG. 8 the respective one or more interfaces 52 are coupled to the respective processing circuitry 54 at the processing device 50. In examples the processing circuitry 54 may be implemented using one or more processing units, one or more processing devices, any means for processing, such as a processor, a computer or a programmable hardware component being operable with accordingly adapted software. Similar, the described functions of the processing circuitry 54 may as well be implemented in software, which is then executed on one or more programmable hardware components. Such hardware components may comprise a general-purpose processor, a Digital Signal Processor (DSP), a micro-controller, etc. The processing circuitry 54 is capable of controlling the interface 52, so that any data transfer that occurs over the interface and/or any interaction in which the interface may be involved may be controlled by the processing circuitry 54.

In an embodiment the processing device 50 may comprise a memory and at least one processing circuitry 54 operably coupled to the memory and configured to perform the below mentioned method.

In examples the one or more interfaces 52 may correspond to any means for obtaining, receiving, transmitting or providing analog or digital signals or information, e.g. any connector, contact, pin, register, input port, output port, conductor, lane, etc. which allows providing or obtaining a signal or information. An interface may be wireless or wireline and it may be configured to communicate, i.e. transmit or receive signals, information with further internal or external components. The one or more interfaces 52 may comprise further components to enable communication between vehicles. Such components may include transceiver (transmitter and/or receiver) components, such as one or more Low-Noise Amplifiers (LNAs), one or more Power-Amplifiers (PAs), one or more duplexers, one or more diplexers, one or more filters or filter circuitry, one or more converters, one or more mixers, accordingly adapted radio frequency components, etc.

More details and aspects are mentioned in connection with the examples described above and/or below. The example shown in FIG. 8 may comprise one or more optional additional features corresponding to one or more aspects mentioned in connection with the proposed concept or one or more examples described above (e.g., FIG. 1-7) and/or below (e.g., FIG. 9-12).

Figure 9:
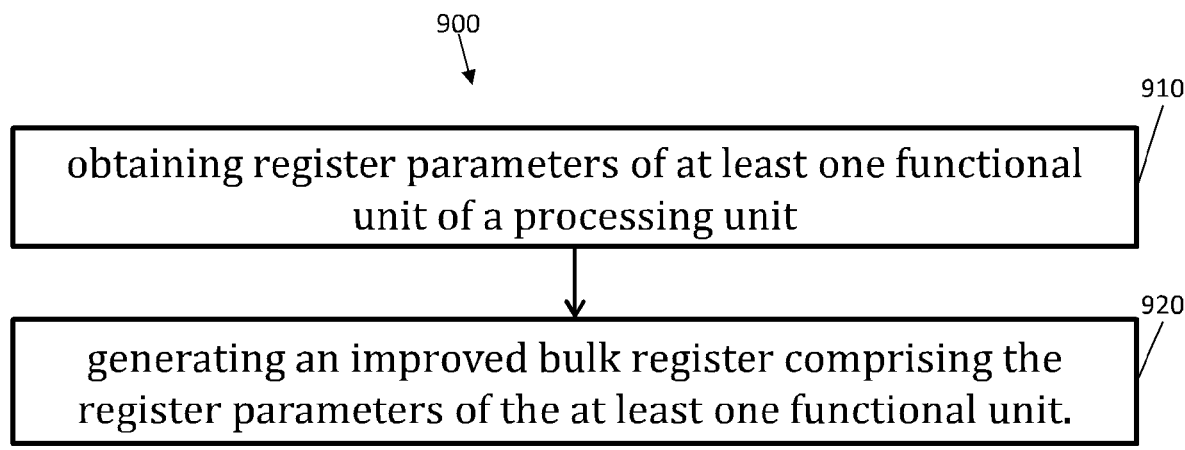
FIG. 9 shows an example of a method for reducing scan traffic.

FIG. 9 shows an example of a method 900 for reducing scan traffic. The method 900 comprises obtaining 910 register parameters of at least one functional unit of a processing unit and generating 920 an improved bulk register comprising the register parameters of the at least one functional unit. For example, the method can be performed by the processing device as described with reference to FIG. 1 and can be transmitted to the processing device as described with reference to FIG. 8.

More details and aspects are mentioned in connection with the examples described above and/or below. The example shown in FIG. 9 may comprise one or more optional additional features corresponding to one or more aspects mentioned in connection with the proposed concept or one or more examples described above (e.g., FIG. 1-8) and/or below (e.g., FIG. 10-12).

Figure 10:
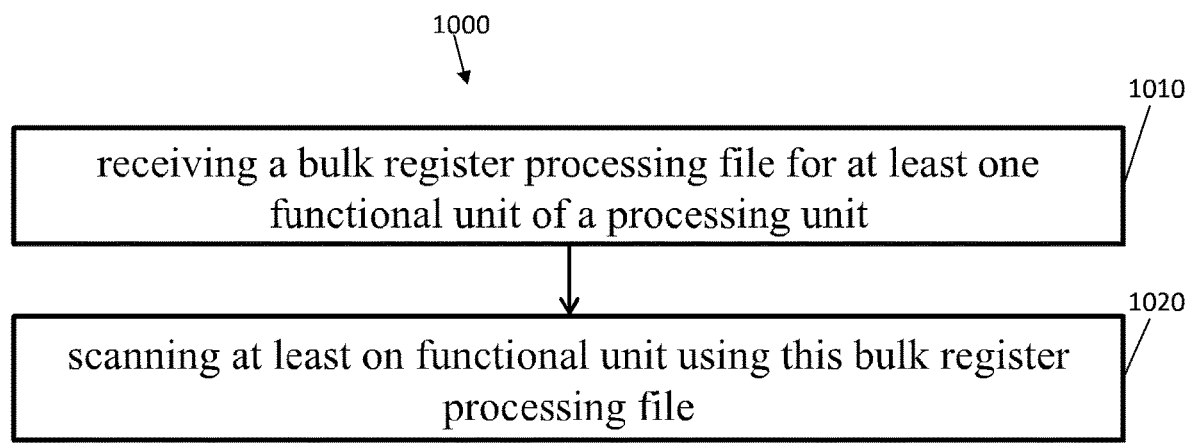
FIG. 10 shows another example of a method for reducing scan traffic.

FIG. 10 shows another example of a method 1000 for reducing scan traffic. The method 1000 comprises receiving 1010 an improved bulk register processing file for at least one functional unit of a processing unit and scanning 1020 at least on functional unit using this improved bulk register processing file. For example, the method can be performed by the processing device as described with reference to FIG. 1 and can be transmitted to the processing device as described with reference to FIG. 8.

More details and aspects are mentioned in connection with the examples described above and/or below. The example shown in FIG. 10 may comprise one or more optional additional features corresponding to one or more aspects mentioned in connection with the proposed concept or one or more examples described above (e.g., FIG. 1-9) and/or below (e.g., FIG. 11-12).

Figure 11:
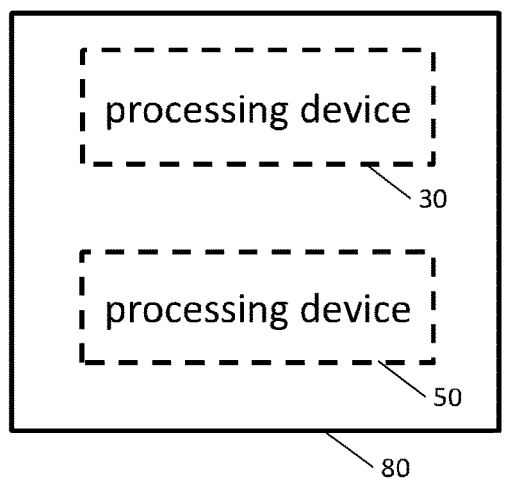
FIG. 11 shows an example of an electronic device.

FIG. 11 shows an example of an electronic device 80. The electronic device 80 comprises the processing device (e.g., as described with reference to FIG. 1) and/or the processing device (e.g., as described with reference to FIG. 7). For example, the electronic device 80 may be a personal computer and/or cloud computing.

More details and aspects are mentioned in connection with the examples described above. and/or below. The example shown in FIG. 11 may comprise one or more optional additional features corresponding to one or more aspects mentioned in connection with the proposed concept or one or more examples described above (e.g., FIG. 1-10) and/or below (e.g., FIG. 12).

Figure 12:
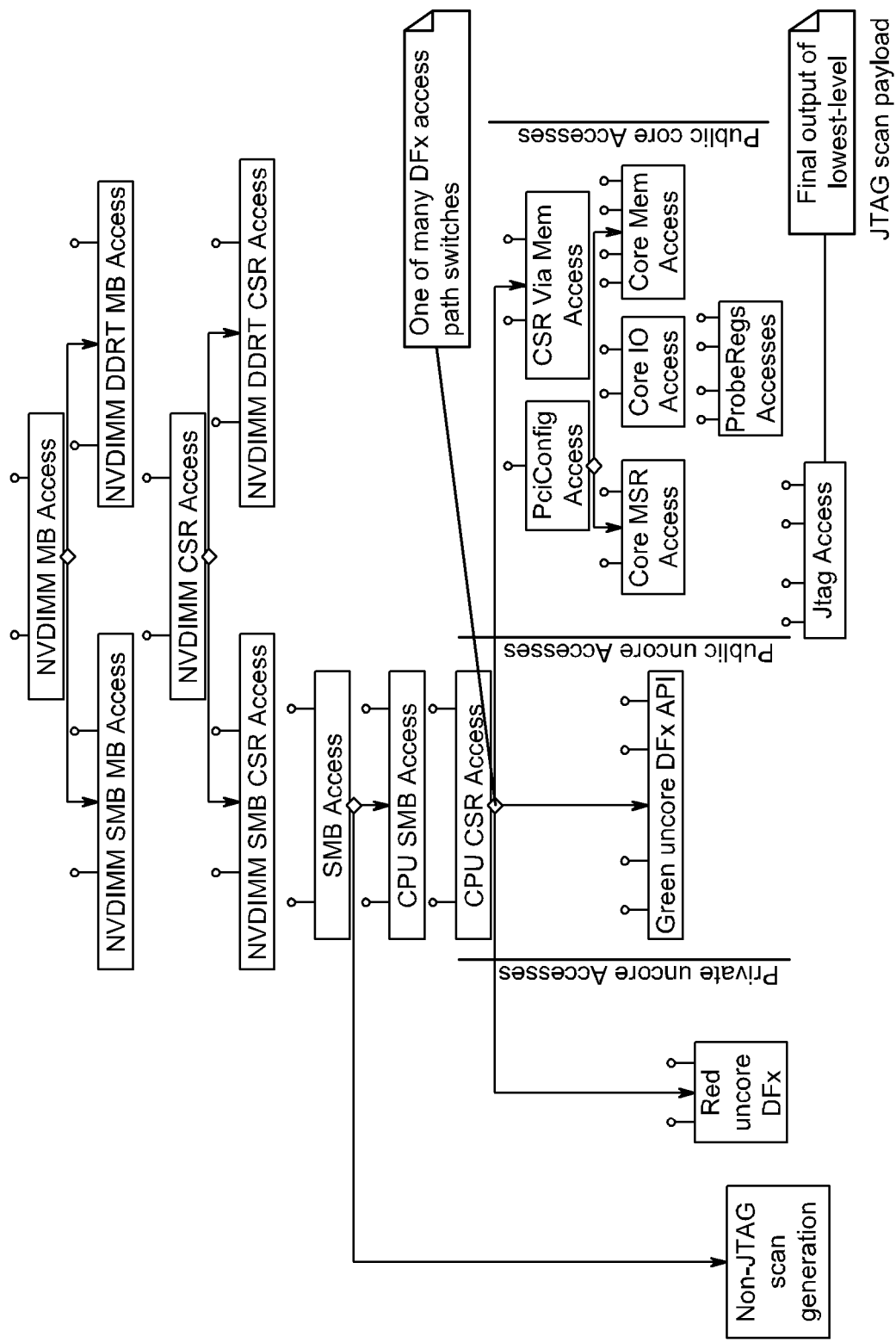
FIG. 12 shows an example of a scan compiler distillation process.

FIG. 12 shows an example of a scan compiler (e.g., described with reference to FIG. 2 and FIG. 3) distillation process. As mentioned above the scan compiler compiles high-level source code and a set of compiler switches into a low-level implementation. In principle, logical operations such as high-level/control requests, e.g., a register request (shown in the upper area of FIG. 12) can be compiled (or distilled) down to a low-level implementation, e.g., a raw access interface language. The scan compiler may combine the difference high-level/control requests to one low-level implantation and may remove extra (e.g., redundant) steps of the highlevel/control requests. Thus, a scan interface clock rate may be decreased and thus a performance may be increased. For example, the high-level access/control request down may take difference compilation/distillation paths and may be routed to different scan types such as JTAG, I2C, etc. depending on the scan compiler configuration.

More details and aspects are mentioned in connection with the examples described above. The example shown in FIG. 10 may comprise one or more optional additional features corresponding to one or more aspects mentioned in connection with the proposed concept or one or more examples described above (e.g., FIG. 1-11).

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

An example (e.g., example 1) relates to a processing device for reducing scan traffic, comprising one or more interfaces configured to transmit information to at least one register access interface; and processing circuitry configured to control the one or more interfaces and to: obtain register parameters of at least one functional unit of a processing unit; and generate an improved bulk register comprising the register parameters of the at least one functional unit.

Another example (e.g., example 2) relates to a previously described example (e.g., example 1) wherein the processing circuitry may be further configured to generate the improved bulk register by compiling the register parameters into a low-level implementation.

Another example (e.g., example 3) relates to a previously described example (e.g., one of the examples 1-2) wherein the processing circuitry may be further configured to generate execution information for the improved bulk register.

Another example (e.g., example 4) relates to a previously described example (e.g., one of the examples 2-3) wherein the processing circuitry may be further configured to: transmit the improved bulk register to the at least one register access interface; receive scan information about a scan performed for the at least one functional unit using the improved bulk register from the at least one register access interface; and generate control information by mapping the received scan information to the register parameters.

Another example (e.g., example 5) relates to a previously described example (e.g., example 4) wherein the processing circuitry is further configured to generate decoding information for mapping the received information to the register parameters.

Another example (e.g., example 6) relates to a previously described example (e.g., one of the examples 2, 3 or 5) wherein the processing circuitry may be further configured to store the improved bulk register, the execution information and/or the decoding information in an improved bulk register processing file.

Another example (e.g., example 7) relates to a previously described example (e.g., example 6) wherein the processing circuitry may be further configured to transmit the improved bulk register processing file to a further processing circuitry.

Another example (e.g., example 8) relates to a previously described example (e.g., one of the examples 1-2) wherein the processing circuitry may be further configured to generate the improved bulk register by choosing a scan operation.

Another example (e.g., example 9) relates to a previously described example (e.g., example 2) wherein the processing circuitry may be further configured to generate the low-level implementation using only register parameters which are assigned to the same register access interface.

Another example (e.g., example 10) relates to a previously described example (e.g., example 1) wherein the processing circuitry may be further configured to obtain the register parameters by dividing the processing unit into the at least one functional unit and addressing register parameters to the at least one functional unit.

Another example (e.g., example 11) relates to a previously described example (e.g., example 4) wherein the processing circuitry may be further configured to perform run-time monitoring of the at least one functional unit using the control information.

Another example (e.g., example 12) relates to a previously described example (e.g., example 11) wherein the processing circuitry may be further configured to perform periodic run-time monitoring on the at least one functional unit of the processing unit using the control information.

An example (e.g., example 13) relates to a processing device for reducing scan traffic, comprising one or more interfaces configured to transmit information to at least one register access interface and to receive information from another processing device; and processing circuitry configured to control the one or more interfaces and to: receive an improved bulk register processing file comprising information about an improved bulk register for at least one functional unit of a processing unit; and use this improved bulk register processing file for scanning the at least on functional unit.

Another example (e.g., example 14) relates to a previously described example (e.g., example 13) wherein the processing circuitry may be further configured to perform periodic run-time monitoring on the at least one functional unit of the processing unit using the improved bulk register processing file.

Another example (e.g., example 15) relates to an electronic device, comprising the processing device according to a previously described example (e.g., one of the examples 1-12) and/or the processing device according to a previously described example (e.g., example 13 or 14).

Another example (e.g., example 16) relates to a method for reducing scan traffic, comprising obtaining register parameters of at least one functional unit of a processing unit; and generating an improved bulk register comprising the register parameters of the at least one functional unit.

Another example (e.g., example 17) relates to a previously described example (e.g., example 16) further comprising compiling the register parameters into a low-level implementation to generate the improved bulk register.

Another example (e.g., example 18) relates to a previously described example (e.g., example 17) further comprising generating execution information for the low-level implementation.

Another example (e.g., example 19) relates to a previously described example (e.g., one of the examples 17 or 18) further comprising generating decoding information for mapping the received information to the register parameters.

Another example (e.g., example 20) relates to a previously described example (e.g., example 16, 17 or 18) further comprising storing the improved bulk register, the execution information and/or the decoding information in an improved bulk register processing file.

Another example (e.g., example 21) relates to a previously described example (e.g., example 20) further comprising transmitting improved bulk register processing file to a further processing circuitry.

What is claimed is:

1. A processing device for reducing scan traffic, comprising:

one or more interfaces configured to transmit information to at least one register access interface; and processing circuitry configured to control the one or more interfaces and to:
- obtain register parameters of a plurality of registers of at least one functional unit of a processing unit, wherein the register parameters include information needed to request an access to the plurality of registers in the at least one functional unit of the processing unit; and
- generate a bulk register access based on the register parameters to access the plurality of registers of the at least one functional unit.

2. The processing device according to claim 1, wherein the processing circuitry is further configured to generate the bulk register access by compiling the register parameters into a low-level implementation.

3. The processing device according to claim 2, wherein the processing circuitry is further configured to generate execution information for the bulk register access.

4. The processing device according to claim 3, wherein the processing circuitry is further configured to:
- transmit the bulk register access to the at least one register access interface;
- receive scan information about a scan performed for the at least one functional unit based on the bulk register access from the at least one register access interface; and
- generate control information by mapping the received scan information to the register parameters.

5. The processing device according to claim 4, wherein the processing circuitry is further configured to generate decoding information for mapping the received scan information to the register parameters.

6. The processing device according to claim 5, wherein the processing circuitry is further configured to store the bulk register access, the execution information and/or the decoding information in a bulk register processing file.

7. The processing device according to claim 6, wherein the processing circuitry is further configured to transmit the bulk register processing file to a further processing circuitry.

8. The processing device according to claim 4, wherein the processing circuitry is further configured to perform run-time monitoring of the at least one functional unit using the control information.

9. The processing device according to claim 8, wherein the processing circuitry is further configured to perform periodic run-time monitoring on the at least one functional unit of the processing unit using the control information.

10. The processing device according to claim 2, wherein the processing circuitry is further configured to generate the bulk register access by choosing a scan operation.

11. The processing device according to claim 2, wherein the processing circuitry is further configured to generate the low-level implementation using only register parameters which are assigned to the same register access interface.

12. The processing device according to claim 1, wherein the processing circuitry is further configured to obtain the register parameters by dividing the processing unit into the at least one functional unit and addressing register parameters to the at least one functional unit.

13. A processing device for reducing scan traffic, comprising;
- one or more interfaces configured to transmit information to at least one register access interface and to receive information from another processing device; and
- processing circuitry configured to control the one or more interfaces and to:
  - receive a bulk register processing file comprising information for a bulk register access including register parameters for accessing a plurality of registers of at least one functional unit of a processing unit; and
  - use the bulk register processing file for scanning the at least one functional unit.

14. The processing device according to claim 13, wherein the processing circuitry is further configured to perform periodic run-time monitoring on the at least one functional unit of the processing unit using the bulk register processing file.

15. A method for reducing scan traffic, comprising:
- obtaining register parameters of a plurality of registers of at least one functional unit of a processing unit, wherein the register parameters include information needed to request an access to the plurality of registers in the at least one functional unit of the processing unit; and
- generating a bulk register access comprising the register parameters to access the plurality of registers of the at least one functional unit.

16. The method according to claim 15, further comprising:
- compiling the register parameters into a low-level implementation to generate the bulk register access.

17. The method according to claim 16, further comprising:
- generating execution information for the low-level implementation.

18. The method according to claim 17, further comprising:
- generating decoding information for mapping the received information to the register parameters.

19. The method according to claim 18, further comprising:
- storing the bulk register access, the execution information and/or the decoding information in a bulk register processing file.

20. A non-transitory, computer-readable medium comprising a program code that, when the program code is executed on a computer, a processor, or a programmable hardware component, performs the method according to claim 15.

* * * * *